US009362261B2

(12) United States Patent
Tokuyama et al.

(10) Patent No.: US 9,362,261 B2
(45) Date of Patent: Jun. 7, 2016

(54) POWER SEMICONDUCTOR MODULE

(71) Applicant: Hitachi Automotive Systems, Ltd., Hitachinaka-shi, Ibaraki (JP)

(72) Inventors: Takeshi Tokuyama, Tokyo (JP); Kinya Nakatsu, Tokyo (JP); Akira Mima, Tokyo (JP); Yukio Hattori, Tokyo (JP); Toshiya Satoh, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/421,508

(22) PCT Filed: Jul. 22, 2013

(86) PCT No.: PCT/JP2013/069724
§ 371 (c)(1),
(2) Date: Feb. 13, 2015

(87) PCT Pub. No.: WO2014/034321
PCT Pub. Date: Mar. 6, 2014

(65) Prior Publication Data
US 2015/0214205 A1 Jul. 30, 2015

(30) Foreign Application Priority Data

Aug. 31, 2012 (JP) ................................. 2012-190810

(51) Int. Cl.
*H01L 29/66* (2006.01)
*H01L 25/18* (2006.01)
(Continued)

(52) U.S. Cl.
CPC ................ *H01L 25/18* (2013.01); *H01L 23/04* (2013.01); *H01L 23/3107* (2013.01);
(Continued)

(58) Field of Classification Search
CPC ................ H01L 23/3107; H01L 23/04; H01L 23/49524; H01L 25/18
USPC ........................................................ 257/139
See application file for complete search history.

(56) References Cited

U.S. PATENT DOCUMENTS

2007/0252169 A1 11/2007 Tokuyama et al.
2008/0186751 A1 8/2008 Tokuyama et al.
(Continued)

FOREIGN PATENT DOCUMENTS

JP 2008-306867 A 12/2008
JP 2011-77464 A 4/2011
WO WO 2012/073570 A1 6/2012

OTHER PUBLICATIONS

International Search Report (PCT/ISA/210) dated Oct. 8, 2013 with English-language translation (Two (2) pages).

*Primary Examiner* — Matthew Gordon
(74) *Attorney, Agent, or Firm* — Crowell & Moring LLP

(57) ABSTRACT

The purpose of the present invention is to reduce the wiring inductance of a power semiconductor module. It comprises a first power semiconductor device, a second power semiconductor device, a first conductor unit which is opposed to the first power semi conductor device, a second conductor unit which is opposed to the first conductor unit across the first power semiconductor device, a third conductor unit which is opposed to the second power semiconductor device, a fourth conductor unit which is opposed to the third conductor unit across the second power semiconductor device, a first intermediate conductor unit which extends from the first conductor unit, a second intermediate conductor unit which extends from the fourth conductor unit and, a positive electrode side first terminal, and a positive electrode side second terminal which project from the first intermediate conductor unit, and a negative electrode side first terminal and a negative electrode side second terminal which project from the second intermediate conductor unit. The negative electrode side first terminal is arranged in a position adjacent to the positive electrode side first terminal. The negative electrode side second terminal is arranged in a position adjacent to the positive electrode side second terminal.

7 Claims, 14 Drawing Sheets

(51) Int. Cl.
*H01L 25/07* (2006.01)
*H01L 23/495* (2006.01)
*H01L 23/04* (2006.01)
*H01L 23/31* (2006.01)
*H01L 29/739* (2006.01)
*H01L 29/861* (2006.01)
*H01L 23/00* (2006.01)
*H02M 7/00* (2006.01)
*H02M 7/5387* (2007.01)
*H02M 1/00* (2006.01)

(52) U.S. Cl.
CPC ... *H01L 23/49524* (2013.01); *H01L 23/49562* (2013.01); *H01L 23/49575* (2013.01); *H01L 24/36* (2013.01); *H01L 24/40* (2013.01); *H01L 25/07* (2013.01); *H01L 25/072* (2013.01); *H01L 29/7393* (2013.01); *H01L 29/861* (2013.01); *H01L 2224/40137* (2013.01); *H01L 2924/0002* (2013.01); *H01L 2924/13055* (2013.01); *H01L 2924/13091* (2013.01); *H02M 7/003* (2013.01); *H02M 7/5387* (2013.01); *H02M 2001/0054* (2013.01); *Y02B 70/1491* (2013.01)

(56) References Cited

U.S. PATENT DOCUMENTS

| | | |
|---|---|---|
| 2008/0251909 A1 | 10/2008 | Tokuyama et al. |
| 2009/0231811 A1 | 9/2009 | Tokuyama et al. |
| 2011/0069455 A1 | 3/2011 | Tokuyama et al. |
| 2011/0228479 A1 | 9/2011 | Tokuyama et al. |
| 2012/0033475 A1 | 2/2012 | Tokuyama et al. |
| 2012/0300522 A1 | 11/2012 | Tokuyama et al. |
| 2013/0194853 A1 | 8/2013 | Tokuyama et al. |
| 2013/0258628 A1 | 10/2013 | Kawanami |
| 2013/0314963 A1 | 11/2013 | Tokuyama et al. |
| 2014/0160821 A1 | 6/2014 | Tokuyama et al. |

POWER SEMICONDUCTOR MODULE

TECHNICAL FIELD

The present invention relates to a power semiconductor module for converting a direct current into an alternating current, and, more particularly, to a power semiconductor module for supplying the alternating current to a motor for driving a hybrid vehicle or an electric vehicle.

BACKGROUND ART

In recent years, what are required are that power converters output a large current and are formed with a small size. If the power converter is intended to output a large current, the heat generated by a power semiconductor device built in the power semiconductor module is increased. Thus, unless the heat capacity of the power semiconductor module or the power converter is large enough, it will reach the heat resistant temperature of the power semiconductor device, thus impeding miniaturization thereof. There has been developed a double sided cooling power semiconductor module which improves its cooling efficiency by cooling down the power semiconductor device from the both sides.

To cool down the double sided cooling power semiconductor module, both main surfaces of the power semiconductor device are sandwiched by lead frames as plate conductors, and a coolant is thermally connected with one surface of one lead frame on the opposite side of a surface opposed to the main surface of the power semiconductor device. Patent literature 1 discloses the invention of a double sided cooling power semiconductor module. In the module, the both main surfaces of the power semi conductor device included in an upper arm and a lower arm of an inverter circuit are sandwiched by the lead frames as the plate conductors. The module has upper and lower arm series circuits in which the upper and lower arms of the inverter circuit are connected in series. In the module, DC positive electrode wirings and DC negative electrode wirings extending from the conductors are parallel and opposed to each other. A resin encapsulation member is arranged therebetween, thereby reducing the wiring inductance while ensuring the insulation, and thus miniaturizing the module.

In enlargement of the current of the power converter, loss reduction of the power semiconductor device is a subject to be attained. To realize this, it is necessary to perform, high-speed switching of the power semiconductor devices with reduced loss. For the high speed switching, it is necessary to re strain the surge voltage generated by the wiring inductances in the wiring conductors of the inverter circuit. To reduce the wiring inductances as the root cause of the surge voltage, an effective structure is to align closely transient currents flowing in opposite directions, and is well known as a laminate structure of the DC positive electrode and the DC negative electrode. However, as the enlargement of the current of the power converter, a further reduction of the wiring inductances is required, at the terminal parts transmitting the DC power supplied to the power semiconductor module.

CITATION LIST

Patent Literature

Patent Literature 1: Japanese Unexamined Patent Application Publication 2011-77464

SUMMARY OF INVENTION

Technical Problem

An object of the present invention is to reduce the wiring inductance of the power semiconductor module.

Solution to Problem

To attain the above object, according to the present invention, there is provided a power semiconductor module, comprising: a first power semiconductor device for forming an upper arm of an inverter circuit; a second power semiconductor device for forming a lower arm of the inverter circuit; a first conductor unit which is opposed to the first power semiconductor device; a second conductor unit which is opposed to the first conductor unit across the first power semiconductor device; a third conductor unit which is opposed to the second power semiconductor device; a fourth conductor unit which is opposed to the third conductor unit across the second power semiconductor device; a first intermediate conductor unit which extends from the first conductor unit; a second intermediate conductor unit which extends from the fourth conductor unit and is formed to be opposed to the first intermediate conductor unit; a positive electrode side first terminal and a positive electrode side second terminal which project from the first intermediate conductor unit; and a negative electrode side first terminal and a negative electrode side second terminal which project from the second intermediate conductor unit, and wherein the negative electrode side first terminal is nearer to the positive electrode side first terminal than to the negative electrode side second terminal, and arranged in a position adjacent to the positive electrode side first terminal, and the negative electrode side second terminal is nearer to the positive electrode side second terminal than to the negative electrode side first terminal, and is arranged in a position adjacent to the positive electrode side second terminal.

Advantageous Effects of Invention

According to the present invention, the reduction of the wiring inductance can be attained.

DESCRIPTION OF EMBODIMENTS

A power converter according to this embodiment will now specifically be described with reference to the drawings.

The power converter according to this embodiment is applicable to hybrid vehicles or pure electric vehicles. As a typical example, explanations will be made to a control structure and a circuit structure when applied to a hybrid vehicle.

Figure 1:
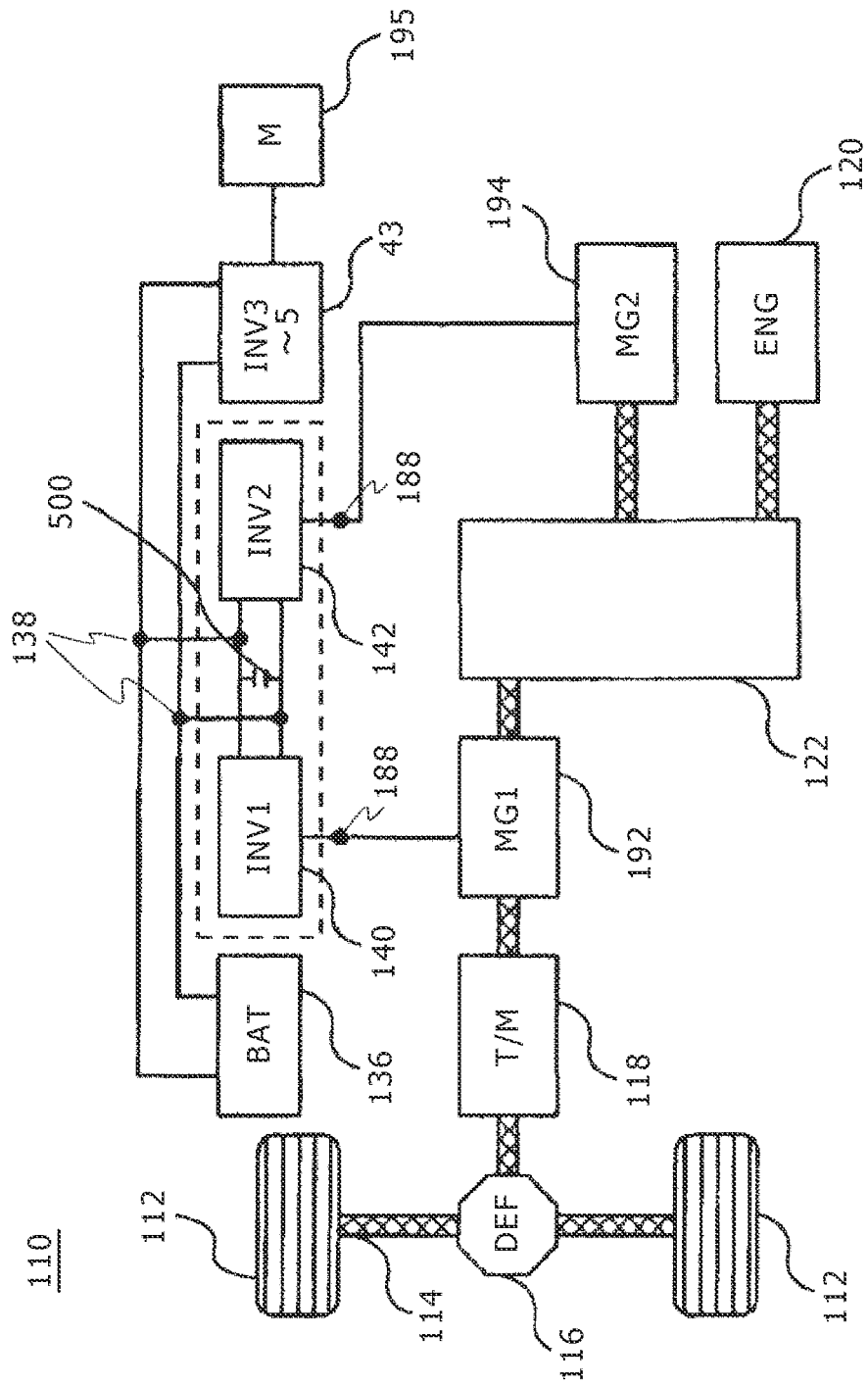
FIG. 1 is a diagram illustrating a control block of a hybrid vehicle.

FIG. 1 is a diagram illustrating a control block of a hybrid vehicle.

As the power converter according to this embodiment, explanations will be made to an inverter device for driving vehicles, for use in an electric system for driving vehicles, and in a very severe loading environment or operational environment, by way of example.

The inverter device for driving vehicles converts DC power supplied from a vehicle battery included in a vehicle power supply or a vehicle power generator into predetermined AC power, and supplies an electric motor for driving vehicles with the obtained AC power to control the driving of the electric motor for driving vehicles. The electric motor for driving vehicles also has a function as a generator. Thus, the inverter device also has a function for converting the AC power generated by the electric motor for driving vehicles into DC power in accordance with its operation mode.

The configuration of this embodiment is suitable as a power converter for driving vehicles, for example, vehicles or trucks. Other than the power converter for these, it is applicable to a power converter (for example, railway train, shipping or aircraft), an industrial power converter (used as a control device of an electric motor for driving the equipment system of a factory), or a power converter for household use (used as a control device of an electric motor for driving household solar power generation system or household electric appliance).

In FIG. 1, a hybrid electric vehicle 110 is an electric vehicle and includes two vehicle driving systems. One of them is an engine system having an engine 120 which is an internal combustion engine as a power source. The engine system is used mainly as a driving source for HEV. The other one is a vehicle electric system having motor generators 192 and 194 as power sources. The vehicle electric system is used mainly as a driving source for HEV and a power generation source for HEV. The motor generators 192 and 194 are, for example, any of synchronous machine or induction machine, operate as generators or as motors in accordance with an operation method, and thus will be described as motor generators.

A front wheel axle 114 is rotatably supported on the front part of the car body, and a pair of front wheels 112 are provided on the both ends of the front wheel axle 114. A rear wheel axle is rotatably supported on the rear part of the car body, and a pair of rear wheels (not illustrated) are provided on the both ends of the rear wheel axle. The HEV of this embodiment adopts the front wheel drive system. However, it may adopt the other system, that is, the rear wheel drive system.

A front wheel side differential gear (hereinafter referred to as a front wheel side DEF) 116 is provided at the center part of the front wheel axle 114. An output shaft of a transmission 118 is mechanically connected onto the input side of the front wheel side DEF 116. The output side of the motor generator 192 is mechanically connected onto the input side of the transmission 118. The output side of the engine 120 and the output side of the motor generator 194 are mechanically connected to the input side of the motor generator 192 through a power distribution mechanism 122. The motor generators 192 and 194, and the power distribution mechanism 122 are contained inside the casing of the transmission 118.

A battery 136 is electrically connected to inverter devices 140 and 142. Electric power can be transmitted and received mutually between the battery 136 and the inverter devices 140 and 142.

This embodiment includes two units: a first electric power generating unit (composed of the motor generator 192 and the inverter device 140) and a second electric power generating unit (composed of the motor generator 194 and the inverter device 142). The two units are used respectively in accordance with the operation states. That is, in a case where the vehicle is driven by power from the engine 120, the second electric power generating unit is operated to generate power by the power of the engine 120 as a power generating unit, when assisting the driving torque of the vehicle. Then, the first electric power generating unit is operated as a power generating unit by the power acquired by the power generation. In the same case, when assisting the vehicle speed of the vehicle, the first electric power generating unit is operated to generate power by the power of the engine 120 as a power generating unit. The second electric power generating unit is operated as a power generating unit by the power acquired by the power generation.

In this embodiment, the first electric power generating unit is operated as a power generating unit by the power of the battery 136, thereby the vehicle can be driven only by the power of the motor generator 192. Further, in this embodiment, the first electric power generating unit or the second electric power generating unit is operated as a power generating unit to generate power by the power of the engine 120 or the power from the wheels, thereby electrically charging the battery 136.

Figure 2:
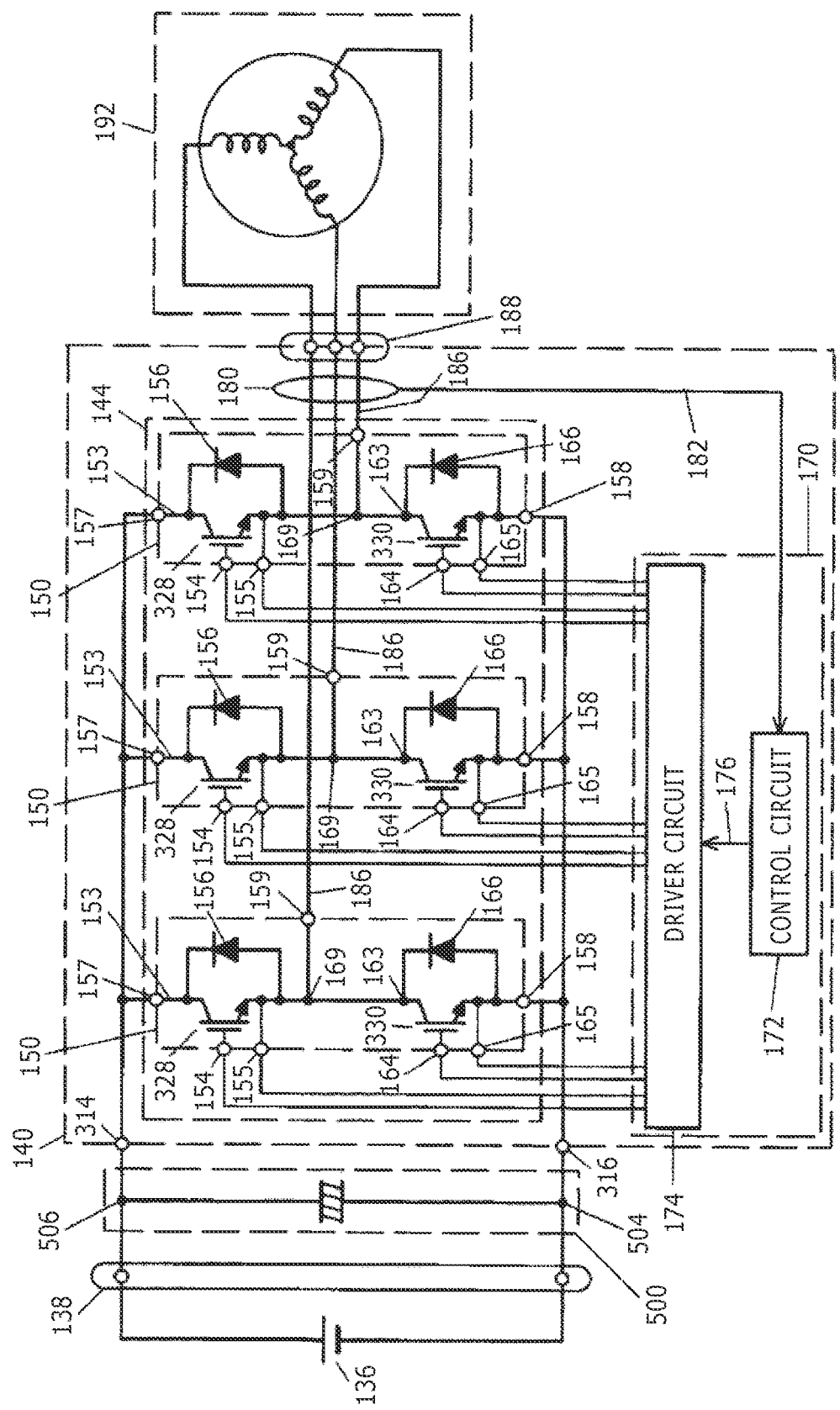
FIG. 2 is a circuit diagram of an inverter device.

The battery 136 is used al so as a power supply for driving a motor 195 for an auxiliary machine. The auxiliary machine may, for example, be a motor for driving a compressor of the air conditioner or a motor for driving a control hydraulic pump. DC power is supplied from the battery 136 to an inverter device 43, converted into AC power at the inverter device 43, and then supplied to the motor 195. The inverter device 43 has the same function as that of the inverter devices 140 and 142, and controls the AC phase, frequency, and power to be supplied to the motor 195. For example, the inverter device supplies AC power having the leading phase with respect to the rotation of the rotor of the motor 195, thereby causing the motor 195 to generate the torque. On the contrary, AC power having the lagging phase is generated. As a result, the motor 195 functions as a power generator, and the motor 195 operates in a regenerative braking state. The control function of this inverter device 43 is the same as the control function of the inverter device 140 or 142. Because the capacity of the motor 195 is smaller than the capacity of the motor generator 192 or 194, the maximum power conversion of the inverter device 43 is smaller than that of the inverter device 140 or 142, but the circuit configuration of the inverter device 43 is substantially the same as the circuit configuration of the inverter device 140 or 142. Explanations will now be made to the electric circuit configuration of the inverter device 140, the inverter device 142, or the inverter device 43, using FIG. 2. In FIG. 2, the inverter device 140 will be explained as a representative example.

An inverter circuit 144 has upper and lower arm series circuits 150 in association with three phases (U phase, V phase, and W phase) corresponding to phase windings of the armature winding of the motor generator 192. Each of the upper and lower arm series circuits 150 includes an IGBT 328 and a diode 156 operating as an upper arm and also an IGBT 330 and a diode 166 operating as a lower arm. Each of the upper and lower arm series 150 is connected to an AC power line (AC busbar) 186, from its midpoint (intermediate electrode 169) to the motor generator 192 through an AC terminal 159 and an AC connector 188.

A collector electrode 153 of the IGBT 328 of the upper arm is electrically connected to a capacitor electrode on the positive electrode side of a capacitor module 500 through a positive electrode terminal (P terminal) 167, and an emitter electrode of the IGBT 330 of the lower arm is electrically connected to a capacitor electrode on the negative electrode side of the capacitor module 500 through a negative terminal (N terminal) 168.

A control unit 170 has a driver circuit 174, which controls the driving of the inverter circuit 144, and a control circuit 172, which supplies the driver circuit 174 with a control signal through a signal line 176. The IGBT 328 or the IGBT 330 operates upon reception of a driving signal output from the control unit 170, and converts the DC power supplied from the battery 136 into three-phase AC power. This converted power is supplied to the armature winding of the motor generator 192.

The IGBT 328 includes the collector electrode 153, an emitter electrode for signal 151, and a gate electrode 154. The IGBT 330 includes a collector electrode 163, an emitter electrode for signal 165, and a gate electrode 164. The diode 156 is electrically connected parallelly to the IGBT 328. The diode 166 is electrically connected parallelly to the IGBT 330. As a switching power semiconductor device, a MOSFET (Metal Oxide Semiconductor Field Effect Transistor) may be used. In this case, the diode 156 or the diode 166 is not necessary. The capacitor module 500 is electrically connected to a positive electrode side capacitor terminal 506 and a negative electrode side capacitor terminal 504, through a DC connector 138. The inverter device 140 is connected to the positive electrode side capacitor terminal 506 through a DC positive electrode terminal 314, and connected to the negative electrode side capacitor terminal 504 through a DC negative electrode terminal 316.

The control circuit 172 includes a micro computer (hereinafter referred to as a "micom") for processing calculation of a switching timing of the IGBTs 328 and 330. Information input, to the "micom" includes a target torque value requested to the motor generator 192, a current value supplied from the upper and lower arm series circuit 150 to the armature winding of the motor generator 192, and also the position of magnetic pole of the rotor of the motor generator 192. The target torque value is based on an instruction signal output from a non-illustrative high-rank control device. The current value has been detected based on a detection signal output from a current sensor 180 through a signal line 182. The position of the magnetic pole has been detected based on a detection signal output from a rotating magnetic pole sensor (not illustrated) provided for the motor generator 192. In this embodiment, explanations will be made to a case where three-phase current values are detected, by way of example. However, current values corresponding to two phases may be detected.

Figure 3:
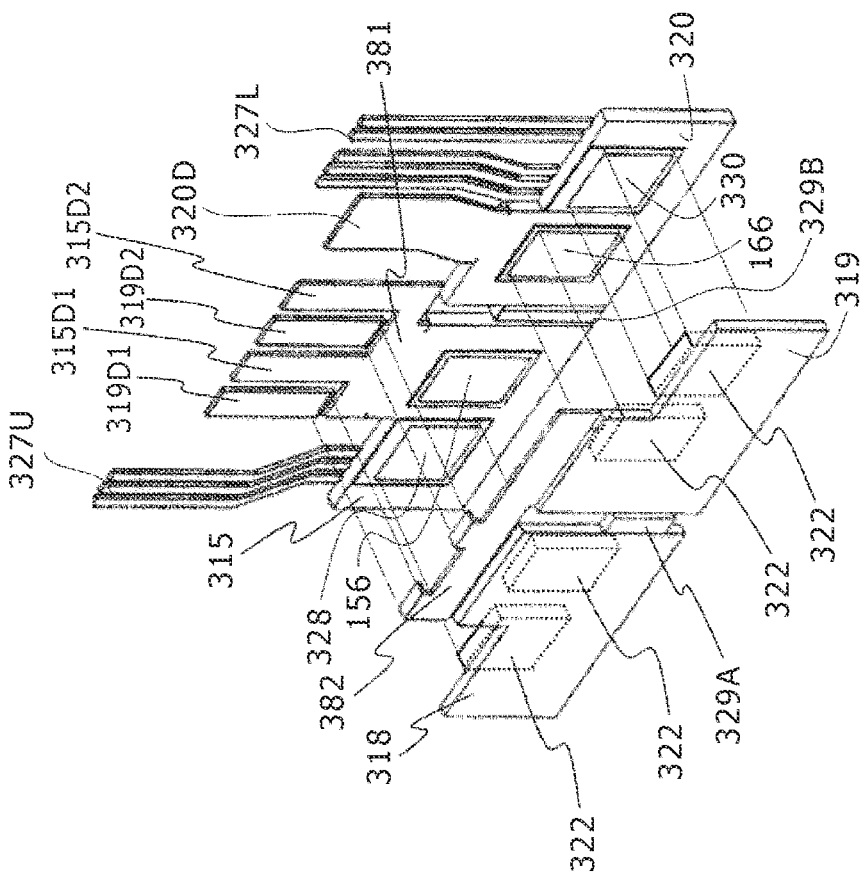
FIG. 3 is an exploded perspective view of circuit components included in a serial circuit of an upper arm and a lower arm of a power semiconductor module 300.

The gate electrode 154 and an emitter electrode for signal 155 in FIG. 2 correspond to a signal connection terminal 327U of FIG. 3, as will be described later, while the gate electrode 164 and the emitter electrode 165 correspond to a signal connection terminal 327L of FIG. 3. A positive electrode terminal 157 is the same as a positive electrode terminal 315D of FIG. 3, and a negative electrode terminal 158 is the same as a DC negative electrode 319D of FIG. 3. The AC terminal 159 is the same as an AC terminal 320D of FIG. 3.

Figure 4:
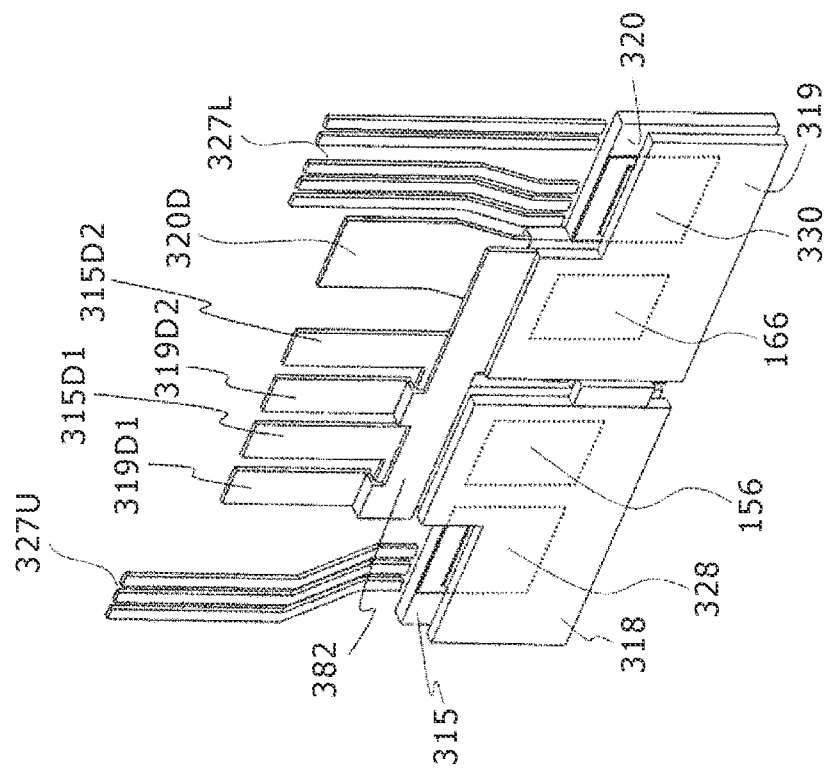
FIG. 4 is an external perspective view after the circuit components illustrated in FIG. 3 have been embedded.
Figure 5:
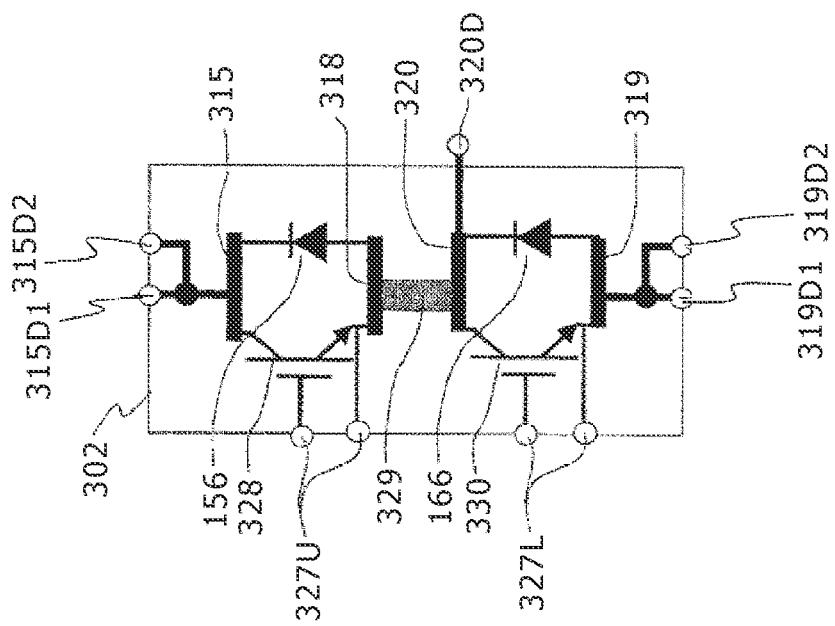
FIG. 5 is a circuit configuration diagram corresponding to FIG. 3 and FIG. 4.

Explanations will now be made to a power semiconductor module 300 according to the embodiment, using FIG. 3 to FIG. 10. FIG. 3 is an exploded perspective view of circuit components included in a serial circuit of an upper arm and a lower arm of the power semiconductor module 300. FIG. 4 is an external perspective view after the circuit components of FIG. 3 are embedded. The IGBT 328 and the diode 156 are included in the upper arm circuit of the inverter circuit. The IGBT 330 and the diode 166 are included in the lower arm circuit. FIG. 5 is a circuit configuration diagram corresponding to FIG. 3 and FIG. 4.

The collector electrode of the IGBT 328 and the cathode electrode of the diode 156 are bonded to a conductor unit 315 using a metal bonding member, such as soldering, while the emitter electrode of the IGBT 328 and the anode electrode of the diode 156 are bonded with an electrode bonding unit 322 using a metal bonding member. The electrode bonding unit 322 may be incorporated together with a conductor unit 318. The conductor unit 315 is opposed to the IGBT 328 and the diode 156. The conductor unit 318 is opposed to the conductor unit 315 through the IGBT 328. The collector electrode of the IGBT 330 and the cathode electrode of the diode 166 are bonded with a conductor unit 320 using a metal bonding member, while the emitter electrode of the IGBT 330 and the anode electrode of the diode 166 are bonded with the electrode bonding unit 322 using a metal bonding member. The electrode bonding unit 322 may be incorporated together with a conductor unit 319. The conductor unit 320 is opposed to the IGBT 330 and the diode 166. The conductor unit 319 is opposed to the conductor unit 320 through the IGBT 330.

An intermediate electrode 329A is connected to the conductor unit 318, and projects from the conductor unit 318 toward the conductor unit 319. An intermediate electrode 329B is connected to the conductor unit 320, and projects from the conductor unit 320 toward the conductor unit 315. The intermediate electrode 329A is opposed to the intermediate electrode 329B, and is bonded with the intermediate electrode 329B using a metal bonding member. The AC terminal 320D is connected to the conductor unit 320.

A first intermediate conductor unit 381 is connected to the conductor unit 315, and connected also to a positive electrode side first terminal 315D1 and a positive electrode side second terminal 315D2. A negative electrode side first terminal 319D1 is arranged on the side part of the positive electrode side first terminal 315D1. A negative electrode side second terminal 319D2 is arranged between the positive electrode side first terminal 315D1 and the positive electrode side second terminal 315D2.

A second intermediate conductor unit 382 is connected to the conductor unit 319, and is formed to be opposed to the first intermediate conductor unit 381. Further, the second intermediate conductor unit 382 is connected to the negative electrode side first terminal 319D1 and the negative electrode side second terminal 319D2, using a metal bonding member.

As a result, the current flowing through the first intermediate conductor unit 381 flows in a direction opposite to that of the current flowing through the second intermediate conductor unit 382, thus causing cancellation of the magnetic fluxes each other. Thus, it is possible to reduce the inductance of the first intermediate conductor unit 381 and the second intermediate conductor unit 382.

In this embodiment, those adjacent terminals of the positive electrode side first terminal 315D1, the positive electrode side second terminal 315D2, the negative side first terminal 319D1, and the negative electrode side second terminal 319D2 are arranged in a line at even intervals.

As a result, the positive electrode side first terminal 315D1 causes cancellation of the magnetic fluxes with the negative electrode side first terminal 319D1 or the negative electrode second terminal 319D2, thereby reducing the inductance of the terminals. The positive electrode side second terminal 315D2 causes cancellation of the magnetic fluxes with the negative electrode side second terminal 319D2, thereby reducing the inductance of the terminals.

Not limited to this embodiment, the negative electrode side first terminal 319D1 may be arranged nearer to the positive electrode side first terminal 315D1 than to the negative electrode side second terminal. 319D2, and arranged in a position adjacent to the positive electrode side first terminal 315D1, while the negative electrode side second terminal 319D2 may be arranged nearer to the positive electrode side second terminal 315D2 than to the negative electrode side first terminal 319D1, and arranged in a position adjacent to the positive electrode side second terminal 315D1. In this case, the magnetic flux is canceled out between the negative electrode side first terminal 319D1 and the positive electrode side first terminal 315D1 to reduce the inductance of the terminals. The magnetic flux is canceled out between the negative electrode side second terminal 319D2 and the positive electrode side second terminal 315D2 to reduce the inductance of the terminals.

The positive electrode side first terminal 315D1 and the positive electrode side second terminal 315D1 have a function for branching the current flowing through the first intermediate conductor unit 381 to avoid concentration of the current in a limited part, thereby reducing the inductance of the wiring. The negative electrode side first terminal 319D1 and the negative electrode side second terminal 319D2 also have a function for branching the current flowing through the second intermediate conductor unit 382 to avoid concentration of the current in a limited part, thereby reducing the inductance of the wiring.

The IGBT 328 and the IGBT 330 are included in a signal electrode on the same surface as the emitter electrode surface. The upper arm signal connection terminal 327U is connected to the signal electrode of the IGBT 328 through wire bonding (not illustrated). The lower arm signal connection terminal 327L is connected to the signal electrode of the IGBT 330 through wire bonding (not illustrated).

The signal connection terminal 327U and the signal connection terminal 327U project parallelly to the projecting direction of the positive electrode side first terminal 315D1 and the positive electrode side second terminal 315D2. The conductor unit 318 is formed smaller than the conductor unit 315, because its part opposed to the gate electrode of the IGBT 328 has been removed therefrom. Thus, the conductor unit 318 has a smaller current path than that of the conductor unit 315. The diode 156 is arranged nearer to the conductor unit 319 or the conductor unit 320 than to the IGBT 328, and the first intermediate conductor unit 381 is formed nearer to the diode 156 than to the IGBT 328. As a result, the diode 156 restrains that the current path gets small.

Similarly, because the part opposed to the gate electrode of the IGBT 330 is removed therefrom, the unit 319 is formed smaller than the conductor unit 320. The diode 166 is arranged nearer to the conductor unit 315 Or the conductor unit 318 than to the IGBT 330, while the second intermediate conductor unit 382 is formed nearer to the diode 166 than to the IGBT 330.

Figure 6:
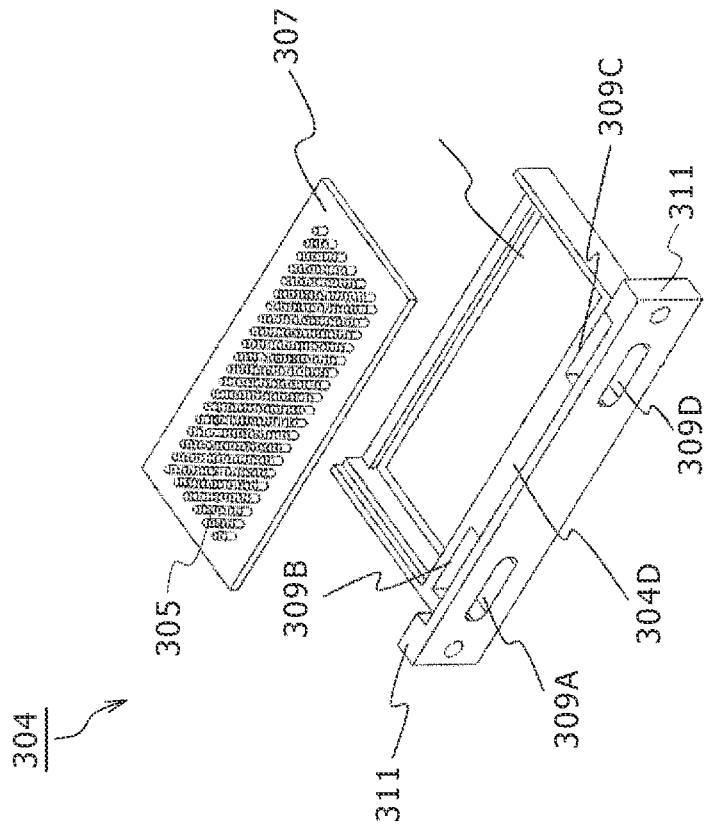
FIG. 6 is an exploded perspective view of a case 304 containing an encapsulated package 302.

FIG. 6 is an exploded perspective view of a case 304 containing an encapsulated package 302. A frame member 304D forms the side wall and bottom surface of the case 304. A base plate 307A is fixed to the frame member 304D, and forms the widest surface of the case 304. A base plate 307B is opposed to the base plate 307A, fixed to the frame member 304D, and forms the widest surface of the case 304. The base plate 307A and the base plate 307B function as a heat dissipation wall of the case 304.

The case 304 is formed from a member having electric conductivity, for example, a compound material of Cu, Cu alloy, Cu—C, and Cu—CuO, or formed from a compound material, such as Al, Al alloy, AlSiC, Al—C. The case 304 is formed using any of a joint technique by performing the welding for high waterproof performance, a forging technique, or a casting technique.

The base plate 307A and the base plate 307B form a fin 305 on their outer surface. A first opening part 309A and a second opening part 309C are formed in the bottom surface of the frame member 304D.

A first through hole 309B is formed near the bottom surface of the frame member 304D. The first through hole 309B penetrates through from the side where the base plate 307B is arranged to the side where the base plate 307A is arranged, in the frame member 304D.

A second through hole 309D is formed near the bottom surface of the frame member 304D. The second through hole 309D penetrates through from the side where the base plate 307B is arranged to the side where the base plate 307A is arranged, in the frame member 304D.

The first opening part 309A is linked to she space inside the first through hole 309B. The second opening part 309C is linked to the space inside the second through hole 309D. A flange 311 is formed on the bottom surface of the frame member 304D, and fixed to a flow channel forming member for forming a flow channel.

Figure 7:
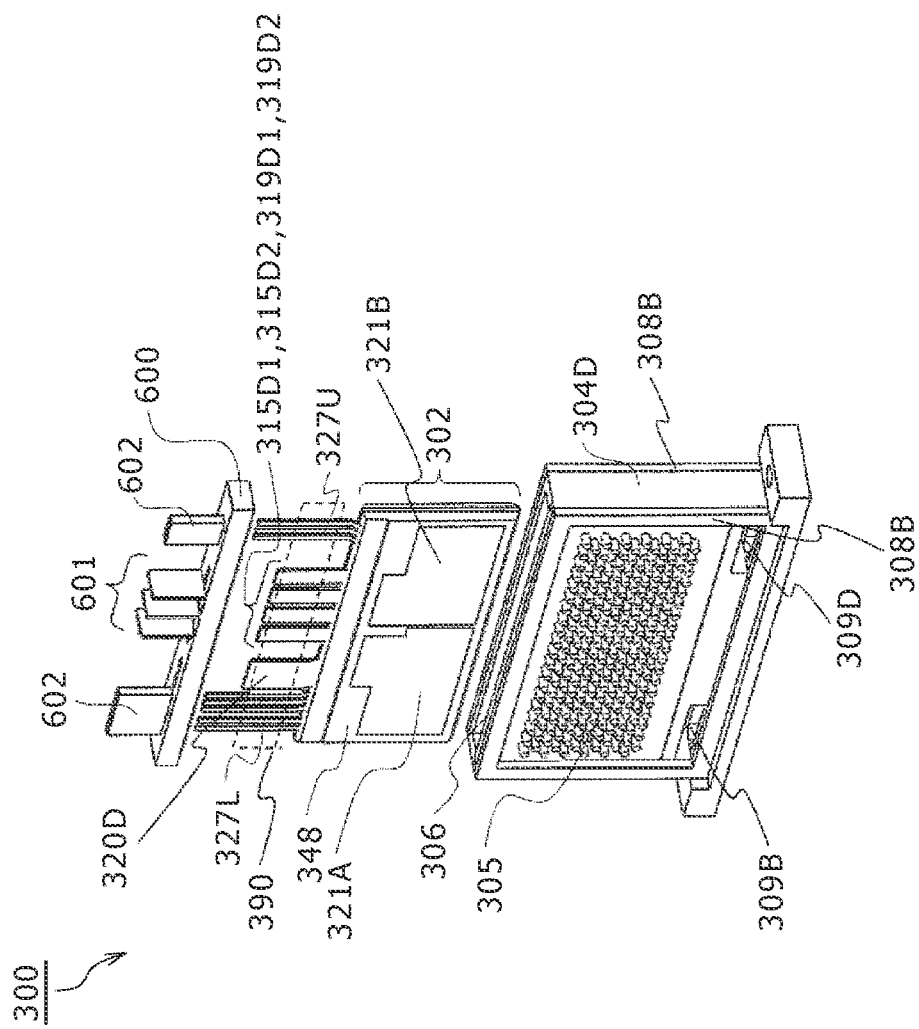
FIG. 7 is an exploded perspective view illustrating a process for putting the encapsulated package 302 into the case 304.

FIG. 7 is an exploded perspective view illustrating a process for putting the encapsulated package 302 into the case 304.

The wall 308B is arranged to surround the fin 305, the first through hole 309B, and the second through hole 309D, and fixed to the frame member 304D. An insertion section 306 is formed in the upper surface of the case 304.

The circuit member of the inverter illustrated in FIG. 4 is encapsulated by a resin encapsulation member 348 to form the encapsulated package 302. An exposed surface 321A is formed by causing; a part of the conductor unit 320 to be exposed from the resin encapsulation member 348. A part of each of the conductor unit 315, the conductor unit 318, and the conductor unit 319 are also exposed from the resin encapsulation member 348, thereby forming the exposed surface 321B.

As the encapsulation resin 348, a novolac-based, polyfunctional-based, or biphenyl-based epoxy resin-based resin may be used. Ceramics ($SiO_2$, $Al_2O_3$, AlN, BN) gel, or rubber is contained therein, thereby enabling making the thermal expansion coefficient closer to that of the conductor units 315, 320, 318, or 319. As a result, the thermal expansion coefficient difference between the members can be reduced, and the thermal stress occurring due to a temperature increase at the use environment can remarkably be decreased. Thus, the life of the power semiconductor module can be extended. As a molding member of an auxiliary mold body 600, a high heat resistance thermoplastic resin, such as PPS (polyphenyl sulfide) or PBT (polybutylene terephthalate), is suited.

The resin encapsulation member 348 encapsulates a part of each of the positive electrode side first terminal 315D1, the positive electrode side second terminal 315D2, the negative side first terminal. 319D1, and the negative electrode side second terminal 319D2. The positive electrode side first terminal 315D1, the positive electrode side second terminal 315D2, and negative side first terminal 319D1, and the negative electrode side second terminal 319D2 are formed in a manner that one surfaces of the terminals get together with a virtual surface 390, and the terminals have an equal thickness.

Accordingly, when the resin encapsulation member 348 is introduced to the terminals fixed in a mold, the resin encapsulation member 348 is restrained from leaking out from the mold, and the productivity of the power semiconductor module can be improved.

The terminal overlapping the virtual surface 390 may include the AC terminal 320D, the signal connection terminal 327U, or the signal connection terminal 327L, thus enabling further improvement the productivity of the power semiconductor module.

The auxiliary mold body 600 has a plurality of through holes for penetration of the positive electrode side first terminal 315D1, the positive electrode side second terminal 315D2, the negative electrode side first terminal 319D1, the negative electrode side second terminal 319D2, the AC terminal 320D, the signal connection terminal 327L, and the signal connection terminal 327U.

A plurality of partition walls 601 are connected to the auxiliary mold body 600. The plurality of partition walls 601 are arranged between the positive electrode side first terminal 315D1 and the negative electrode side first terminal 319D1, between the negative electrode side first terminal 319D1 and the positive electrode side second terminal 315D2, and between the positive electrode side second terminal 315D2 and the negative electrode side second terminal 319D2. A resin cover 602 connected to the auxiliary mold body 600 covers the signal connection terminal 327L and the signal connection terminal 327U.

Figure 8:
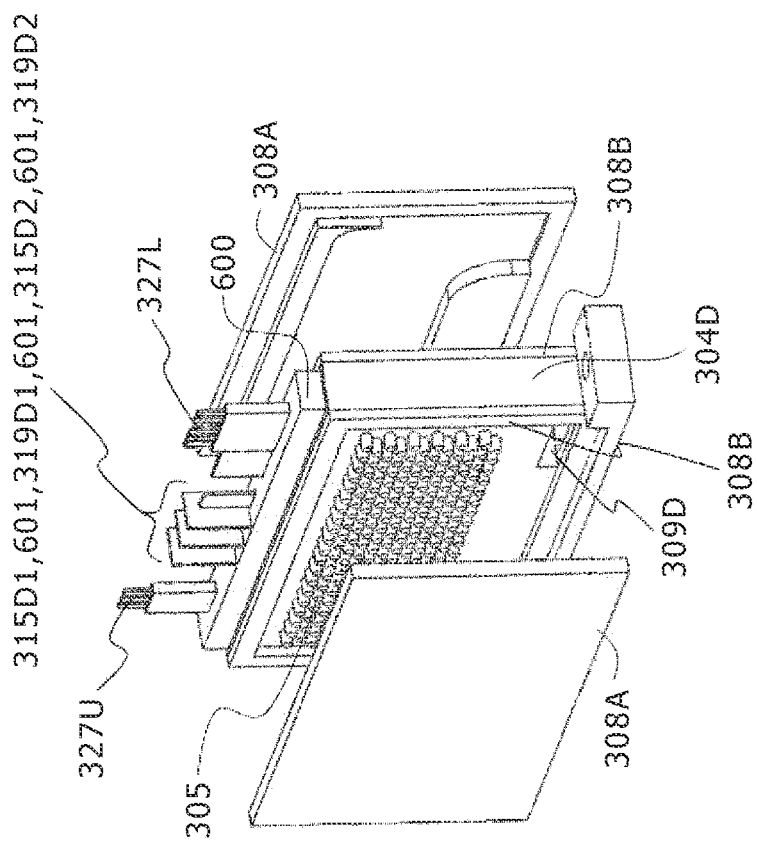
FIG. 8 is an external perspective view illustrating a process for fixing a lid body 308A to a wall 308B.

FIG. 8 is an external perspective view illustrating a process for fixing a lid body 308A to the wall 308B. The lid body 308A is arranged to cover the fin 305, the first through hole 309B, and the second through hole 309D. As a result, as a flow channel space, there is formed a space using the lid body 308A, the wall 308B, the base plate 307B, and the frame member 304D. Specifically, a refrigerant flows from the first opening part 309A, is branched at the first through hole 309B, and flows through two flow channel spaces. The branched refrigerants meet at the second through hole 309D, and flow out from the second opening part 309C.

Figure 9:
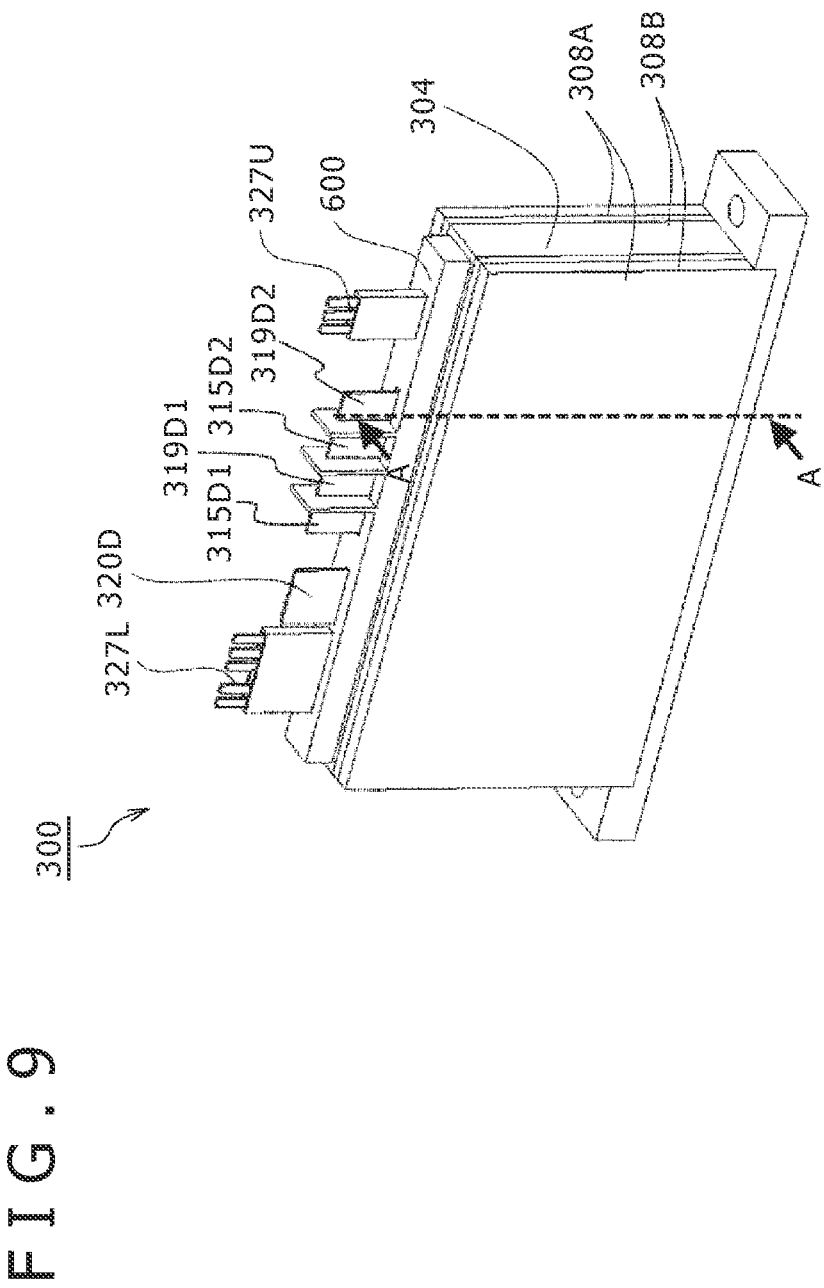
FIG. 9 is an external perspective view of a power semiconductor module 300.
Figure 10:
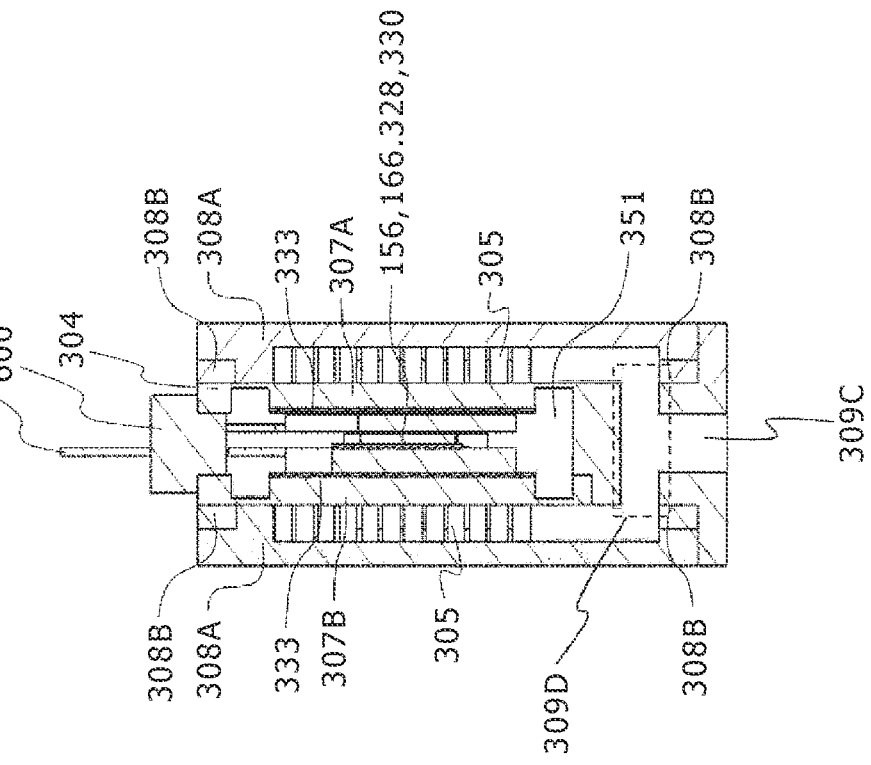
FIG. 10 is a cross sectional view of a cross section taken from a direction of an arrow of a cross section AA in FIG. 9.

FIG. 9 is an external perspective view of the power semiconductor module 300. FIG. 10 is a cross sectional view of a cross section taken from a direction of an arrow of a cross section AA in FIG. 9. One surface of the encapsulated package 302 is joined to the base plate 307B through an insulating member 333. The other surface of the encapsulated package 302 is joined to the base plate 307A through the insulating member 333. As a result, the generation of heat of the power semiconductor devices is efficiently transferred to the fin 305. After the encapsulated package 302 is inserted into the case 304, a potting member 351 is filled in the case 304.

Figure 11:
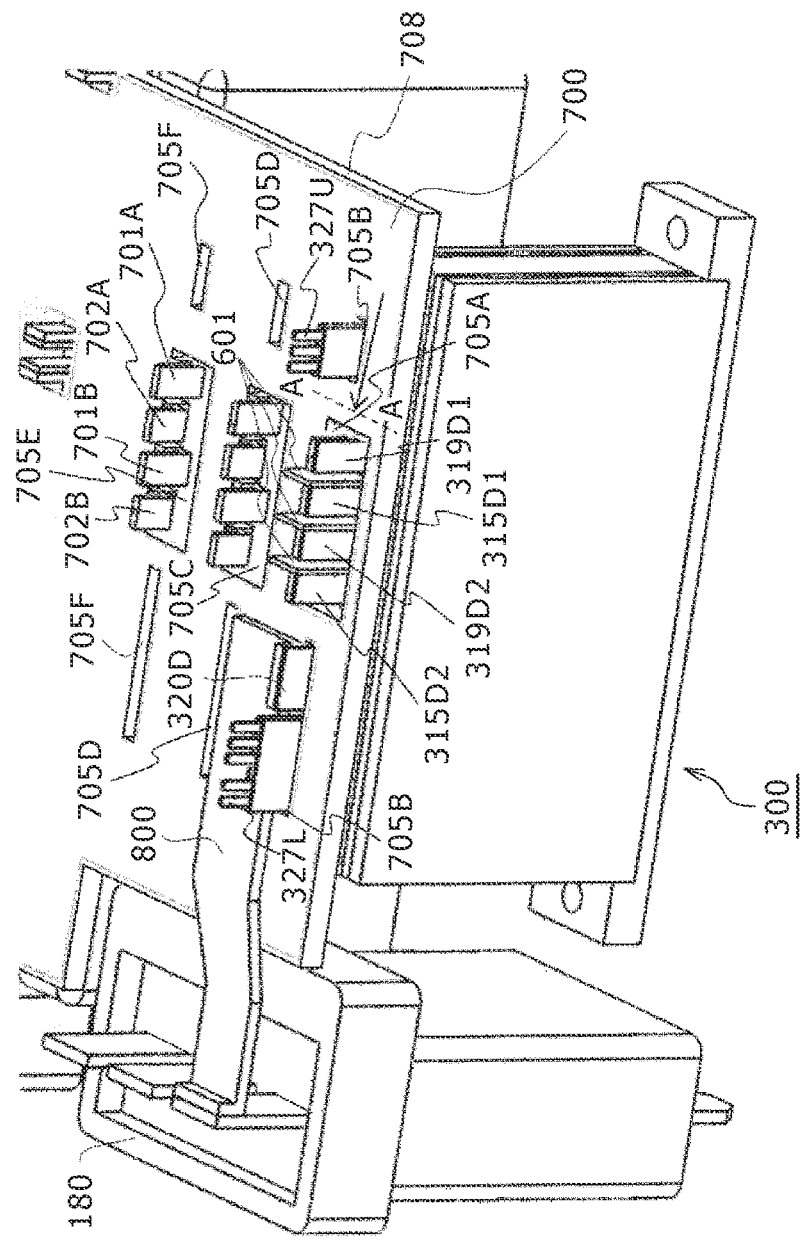
FIG. 11 is an external perspective view illustrating a state in which a power board 700 and the power semiconductor module 300 are connected to each other.
Figure 12:
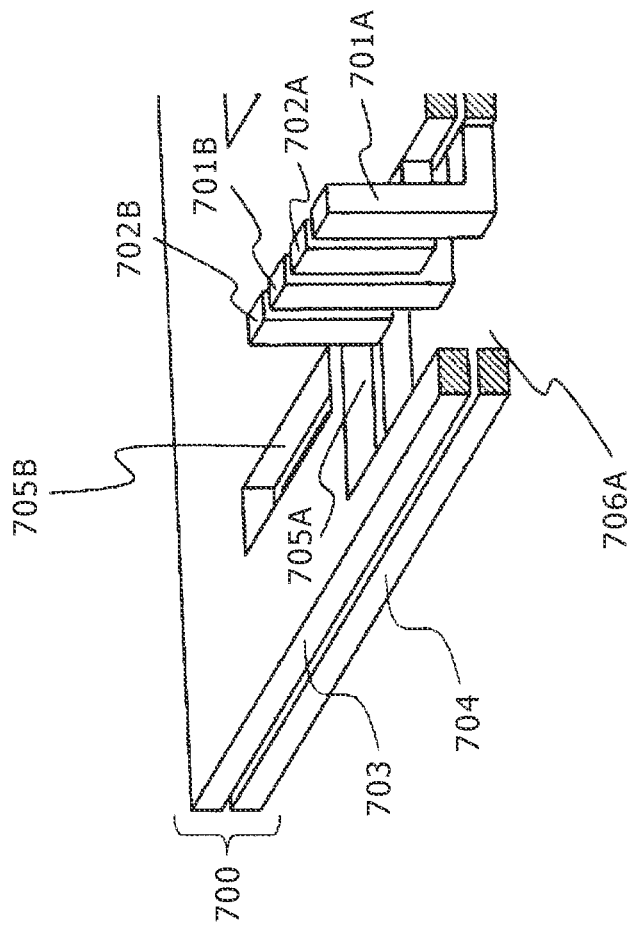
FIG. 12 is a cross sectional view seen from a direction of an arrow of a cross section AA in FIG. 11.

FIG. 11 is an external perspective view illustrating a state where a power board 700 and the power semiconductor module 300 are connected. FIG. 12 is a cross sectional view seen from a direction of an arrow of a cross section AA in FIG. 11.

The power board 700 is composed of a positive electrode side board 703, a negative electrode side board 701, and an insulating covering member 708 for encapsulating them. The positive electrode side board 703 has a first through hole 705A for penetration of the positive electrode side first terminal 315D1, the positive electrode side second terminal 315D2, the negative electrode side first terminal 319D1, the negative electrode side second terminal 319D2, and the partition walls 601. Similarly, the negative electrode side board 704 has a first through hole 706A for penetration of the positive electrode side first terminal 315D1, the positive electrode side second terminal 315D2, the negative electrode side first terminal 319D1, the electrode side second terminal 319D2, and the partition walls 601. This first through hole 706A is formed in a position opposed to the first through hole 705A.

The positive electrode side board 703 has a second through hole 705B for penetration of the AC terminal 320D, the signal connection terminal 327L, and the signal connection terminal 327U. Similarly, the negative electrode side board 704 has a second through hole (not illustrated) for penetration of the AC terminal 320D, the signal connection terminal 327L, or the signal connection terminal 327U. This second through hole is formed in a position opposed to the second through hole 705B.

Other than these, a through hole 705C, a through hole 705D, a through hole 705E, and a through hole 705F are formed in a manner similar to the first through hole 705A and the second through hole 705B.

A positive electrode side first terminal 701A and a positive electrode side second terminal 701B project from the side wall which forms the first through hole 705A, and are bent into a vertical direction of the main surface of the positive electrode side board 703. Similarly, a negative electrode side first terminal 702A and a negative electrode side second terminal 702B project from the side wall which forms the first through hole 706A, and are bent into a vertical direction of the main surface of the negative electrode side board 704.

The negative electrode side first terminal 701A is formed to be opposed to the negative electrode side first terminal 319D1 on the side of the power semiconductor module 300. The negative electrode side second terminal 701B is formed to be opposed to the negative electrode side second terminal 319D2 on the side of the power semiconductor module 300. The positive electrode side first terminal 702A is formed to be opposed to the positive electrode first terminal 315D1 on the side of the power semiconductor module 300. The positive electrode side second terminal 702B is formed to be opposed to the positive electrode side second terminal 315D2 on the side of the power semiconductor module 300. For the connection joint, welding joint (for example, TIG welding or FSW) or mechanical joint (caulking or screw fastening) may be applied.

That is, the negative electrode side first terminal 702A is arranged between the positive electrode side first terminal 701A and the positive electrode side second terminal 701B, while the positive electrode side second terminal 701B is arranged between the negative electrode side first terminal 702A and the negative electrode side second terminal 702B.

As a result, the negative electrode side first terminal 702A causes cancellation of the magnetic fluxes with the positive electrode side first terminal 701A or the positive electrode side second terminal 701B, thus enabling reduction of the inductance. The negative electrode side second terminal 702B causes cancellation of the magnetic fluxes with the positive electrode side second terminal 701B, thus enabling reduction of the inductance.

The partition walls 601 are arranged between the positive electrode side first terminal 701A and the negative electrode side first terminal 702A, between the negative electrode side first terminal 702A and the positive electrode side second terminal 701B, and between the positive electrode side second terminal 701B and the negative electrode side second terminal 702B, and ensure the insulation distance between the terminals.

An AC busbar 800 is arranged on the upper surface of the power board 700, connected to the AC terminal 320D, and also connected to the current sensor 180.

Figure 13A:
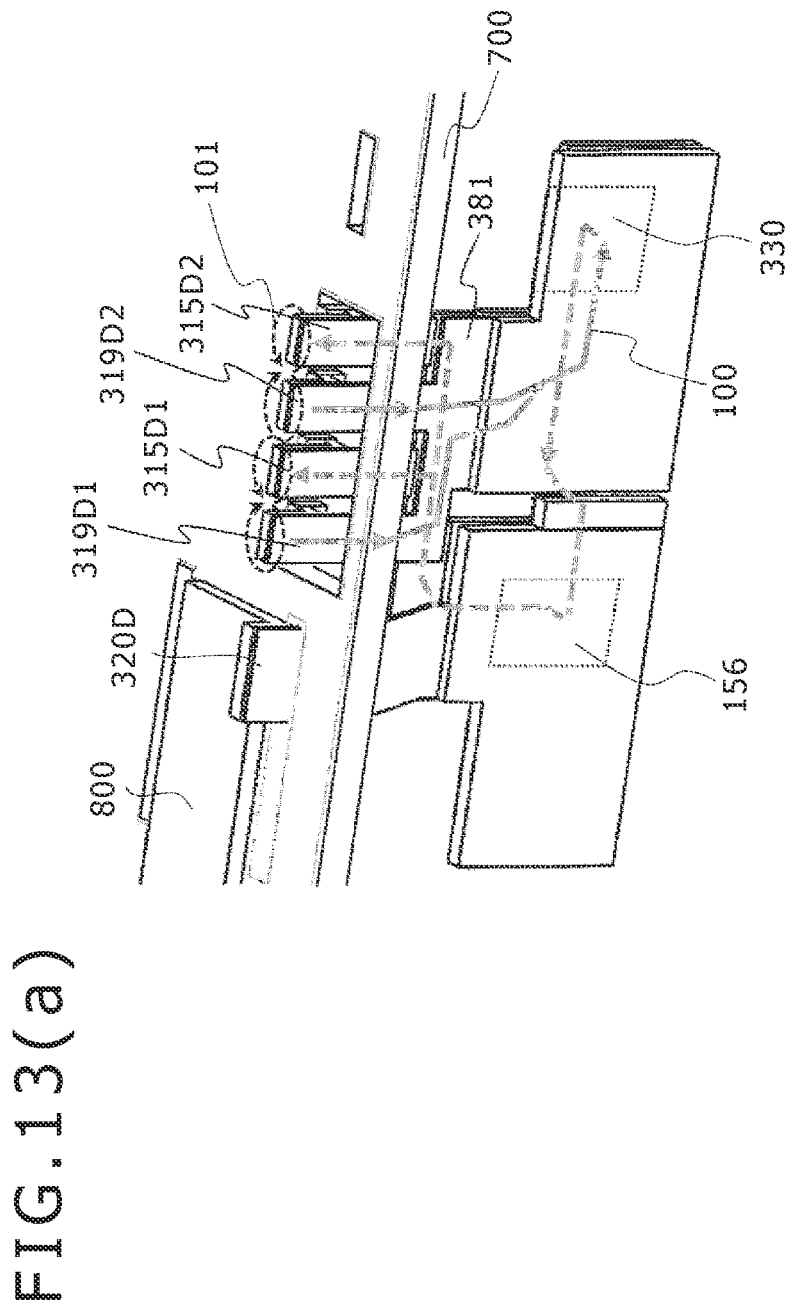
FIG. 13(a) is a perspective view illustrating a recovery current path circulating thereinside, at the time of switching operation of the power semiconductor module 300.
Figure 13B:
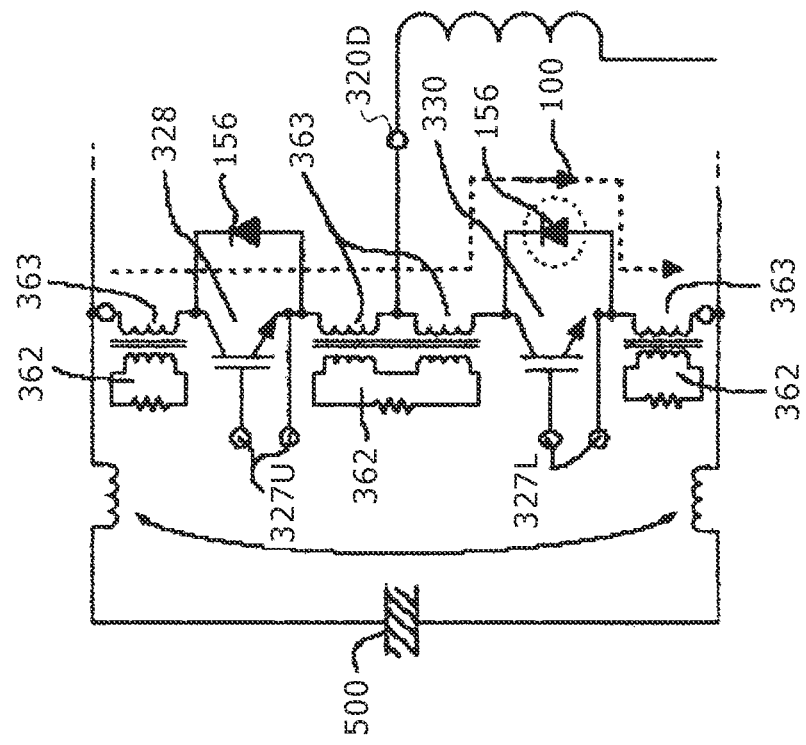
FIG. 13(b) is a circuit diagram illustrating the recovery current path circulating thereinside, at the time of switching operation of the power semiconductor module 300.

FIG. 13(a) is a perspective view illustrating a recovery current path circulating thereinside, at the time of switching operation of the power semiconductor module 300, while FIG. 13(b) is a circuit diagram illustrating the recovery current path circulating thereinside, at the time of switching operation of the power semiconductor module 300. As illustrated in FIG. 13(a), the power semiconductor module 300 and the power board 700 are connected with each other. Induction fields 101 of the positive electrode side first terminal 315D1, the positive electrode side second terminal 315D2, the negative electrode side first terminal 319D1, and the negative electrode side second terminal 319D2 are reduced by cancellation. These fields are generated by the recovery current penetrating through the upper and lower arm series circuit at the time of switching operation. It is possible to realize the low inductance near the terminal connection parts where wiring inductances are most frequently formed. The first intermediate conductor unit 381 is formed to be opposed to the second intermediate conductor unit 382. That is, magnetic fields generated at an inductance 362 and an inductance 363 illustrated in FIG. 13(b) are canceled out each other.

REFERENCE SIGNS LIST

43 Inverter Device
110 Hybrid Vehicle
112 Front Wheels
114 Front Wheel Axle
116 For Wheel Side Differential Gear
118 Transmission
120 Engine
122 Power Distribution Mechanism
136 Battery
138 DC Connector
140, 142 Inverter Device
143 Power Converter
144 Inverter Circuit
150 Upper And Lower Arm Series Circuit
151 Emitter Electrode For Signal
153 Collector Electrode
154 Gate Electrode
156 Diode
157 Positive Electrode Terminal
158 Negative Electrode Terminal
159 AC Terminal
163 Collector Terminal
164 Gate Electrode
165 Emitter Electrode For Signal
166 Diode
167 Positive Electrode Terminal (P Terminal)
168 Negative Electrode Terminal (N Terminal)
169 Intermediate Electrode
170 Control Unit
172 Control Circuit
174 Driver Circuit
176 Signal Line
180 Current Sensor
182 Signal Line
186 AC Pusher
188 AC Connector
192 Motor Generator
194 Motor Generator
195 Motor For Auxiliary Machine
300 Power Semiconductor Module
302 Encapsulated package
304 Case
304D Frame Member
305 Fin
306 Insertion Section
307A Base Plate
307B Base Plate
308A Lid Body
308B Wall
309A First Opening Part
309B Firth Through Hole
309C second Opening Part
309D Second Through Hole
311 Flange
315 Conductor Unit
315D1 Positive Electrode Side First Terminal
315D2 Positive Electrode Side Second Terminal
316 DC Negative Electrode Terminal
318 Conductor Unit
319 Conductor Unit
319D1 Negative Electrode Side First Terminal
319D2 Negative Electrode Side Second Terminal
320 Conductor Unit
320D AC Terminal
321A Exposed Surface
321B Exposed Surface
322 Electrode Bonding Unit
327U Signal Connection Terminal
327L Signal Connection Terminal
328 IGBT
329A Intermediate Electrode
329B Intermediate Electrode
330 IGBT
333 Insulating Member
348 Resin Encapsulation Member
381 First intermediate Conductor Unit
382 Second Intermediate Conductor Unit
390 Virtual Surface
600 Auxiliary Mold Body
601 Partition Wall
602 Resin Cover
700 Power Board
701A Negative Electrode Side First Terminal
701B Negative Electrode Side Second Terminal
702A Positive Electrode Side First Terminal
702B Positive Electrode Side Second Terminal
703 Positive Electrode Side Board
704 Negative Electrode Side Board
705A First Through Hole
705B Second Through Hole
705C Through Hole
705D Through Hole
705E Through Hole
705F Through Hole 706A First Through Hole
708 Insulating Covering Member
800 AC Busbar

The invention claimed is:

1. A power semiconductor inverter comprising:
   a first power semiconductor device for forming an upper arm of an inverter circuit;
   a second power semiconductor device for forming a lower arm of the inverter circuit;
   a first conductor unit which is opposed to the first power semiconductor device;
   a second conductor unit which is opposed to the first conductor unit across the first power semiconductor device;
   a third conductor unit which is opposed to the second power semiconductor device;
   a fourth conductor unit which is opposed to the third conductor unit across the second power semiconductor device;
   a first intermediate conductor unit which extends from the first conductor unit;
   a second intermediate conductor unit which extends from the fourth conductor unit and is formed to be opposed to the first intermediate conductor unit;
   a positive electrode side first terminal and a positive electrode side second terminal which project from the first intermediate conductor unit; and
   a negative electrode side first terminal and a negative electrode side second terminal which project from the second intermediate conductor unit,
   wherein the negative electrode side first terminal is nearer to the positive electrode side first terminal than to the negative electrode side second terminal, and arranged in a position adjacent to the positive electrode side first terminal, and
   the negative electrode side second terminal is nearer to the positive electrode side second terminal than to the negative electrode side first terminal, and is arranged in a position adjacent to the positive electrode side second terminal.

2. The power semiconductor module according to claim 1, wherein the positive electrode side first terminal, the positive electrode side second terminal, the negative electrode side first terminal, and the negative electrode side second terminal are arranged in a manner that adjacent terminals are in a line at equal intervals.

3. The power semiconductor module according to claim 1, comprising:
   an encapsulation member which encapsulates the first power semiconductor device, the second power semiconductor device, the first to fourth conductor units, and the first and second intermediate conductors,
   wherein the respective positive electrode side first terminal, the positive electrode side second terminal, the negative electrode side first terminal, and the negative electrode side second terminal are arranged on a same surface, and have an equal thickness, and
   the encapsulation member encapsulates parts of the respective positive electrode side first terminal, the positive electrode side second terminal, the negative electrode side first terminal, and the negative electrode side second terminal.

4. The power semiconductor module according to claim 1, comprising:
   a first insulating member which is arranged between the negative electrode side first terminal and the positive electrode side first terminal; and
   a second insulating member which is arranged between the negative electrode side second terminal and the positive electrode side second terminal.

5. The power semiconductor module according to claim 1, comprising:
   a first control side terminal which transmits a driving signal for the first power semiconductor device; and
   a second control side terminal which transmits a driving signal for the second power semiconductor device,
   wherein the positive electrode side first terminal, the positive electrode side second terminal, the negative electrode side first terminal, the negative electrode side second terminal, and the first and second control terminals are formed in a manner that the terminals project in a same direction.

6. The power semiconductor module according to claim 5, comprising:
   a first insulating member which is arranged between the negative electrode side first terminal and the positive electrode side first terminal;
   a second insulating member which is arranged between the negative electrode side second terminal and the positive electrode side second terminal;
   a first insulation cover which covers the first control terminal;
   a second insulation cover which covers the second control terminal; and
   a fixing member which fixes the first insulating member, the second insulating member, the first insulation cover, and the second insulation cover.

7. The power semiconductor module according to claim 1, comprising:
   a first diode for forming an upper arm of the inverter circuit; and
   a second diode for forming a lower arm of the inverter circuit,
   wherein the first power semiconductor device has a first collector electrode formed on one surface, a first emitter electrode formed on other surface, and a first gate electrode formed on the other surface,
   the second power semiconductor device has a second collector electrode formed on one surface, a second emitter electrode formed on other surface, and a second gate electrode formed on the other surface,
   the first collector electrode is connected to the first conductor unit through a metal bonding member,
   the first emitter electrode is connected to the second conductor unit through a metal bonding member,
   the second collector electrode is connected to the third conductor unit through a metal bonding member,
   the second emitter electrode is connected to the fourth conductor unit through a metal bonding member,
   the second conductor unit is formed smaller than the first conductor unit,
   the fourth conductor unit is formed smaller than the third conductor unit,
   the first diode is arranged nearer to the fourth conductor unit than to the first power semiconductor device,
   the second diode is arranged nearer to the second conductor unit than to the second power semiconductor device,
   the first intermediate conductor unit is arranged nearer to the first diode than to the first power semiconductor unit, and
   the second intermediate conductor unit is arranged nearer to the second diode than to the second power semiconductor device.

* * * * *